United States Patent
Lee et al.

(10) Patent No.: US 9,311,985 B2
(45) Date of Patent: Apr. 12, 2016

(54) MEMORY AND MEMORY SYSTEM FOR PERIODIC TARGETED REFRESH

(71) Applicant: SK hynix Inc., Gyeonggi-do (KR)

(72) Inventors: Yo-Sep Lee, Gyeonggi-do (KR); Choung Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 6 days.

(21) Appl. No.: 14/298,581

(22) Filed: Jun. 6, 2014

(65) Prior Publication Data

US 2015/0170733 A1    Jun. 18, 2015

(30) Foreign Application Priority Data

Dec. 18, 2013   (KR) .................... 10-2013-0158151

(51) Int. Cl.
| | |
|---|---|
| *G11C 11/401* | (2006.01) |
| *G11C 11/406* | (2006.01) |
| *G11C 7/02* | (2006.01) |
| *G11C 11/408* | (2006.01) |

(52) U.S. Cl.
CPC ............ *G11C 11/40615* (2013.01); *G11C 7/02* (2013.01); *G11C 11/406* (2013.01); *G11C 11/4087* (2013.01)

(58) Field of Classification Search
CPC ........... G11C 11/406; G11C 11/40615; G11C 11/4087; G11C 7/02
See application file for complete search history.

(56) References Cited

U.S. PATENT DOCUMENTS

| | | | |
|---|---|---|---|
| 9,087,554 B1* | 7/2015 | Park | |
| 2014/0006703 A1* | 1/2014 | Bains et al. | 711/106 |
| 2014/0281207 A1* | 9/2014 | Mandava et al. | 711/106 |
| 2015/0058549 A1* | 2/2015 | Jeffrey et al. | 711/106 |

FOREIGN PATENT DOCUMENTS

| | | |
|---|---|---|
| KR | 1020080072063 | 8/2008 |
| KR | 1020120049031 | 5/2012 |
| KR | 1020150002112 | 1/2015 |

* cited by examiner

*Primary Examiner* — Douglas King
*Assistant Examiner* — Jerome LeBoeuf
(74) *Attorney, Agent, or Firm* — IP & T Group LLP (57) ABSTRACT

A memory includes a plurality of word lines, a target address generation unit generating one or more target addresses by using a stored address, a refresh control section activating a refresh signal in response to a refresh command that is periodically inputted and periodically activating the refresh signal in a self-refresh mode, a target refresh control section activating a target refresh signal when the refresh signal is activated M times, wherein the M is a natural number, and deactivating the target refresh signal in the self-refresh mode, and a row control section sequentially refresh a plurality of first word lines in response to the refresh signal and refreshing a second word line corresponding to the target address in response to the refresh signal when the target refresh signal is activated.

16 Claims, 8 Drawing Sheets

MEMORY AND MEMORY SYSTEM FOR PERIODIC TARGETED REFRESH

CROSS-REFERENCE TO RELATED APPLICATIONS

The present application claims priority of Korean Patent Application No. 10-2013-0158151 filed on Dec. 18, 2013, which is incorporated herein by reference in its entirety.

BACKGROUND

1. Field

Exemplary embodiments of the present invention relate to a memory and a memory system.

2. Description of the Related Art

A memory cell of a memory includes a transistor serving as a switch and a capacitor that stores a charge (data). 'High' (logic 1) and 'low' (logic 0) data values are determined depending on whether there is charge in the capacitor of the memory cell, that is, whether the terminal voltage of the capacitor is high or low.

Since storage of data indicates the accumulation of a charge in the capacitor, in theory energy is not consumed during data storage. However, since the initial charge stored in the capacitor is reduced due to current leakage at the PN junction, as well as other places of a MOS transistor, data may be lost. In order to prevent such loss, data in the memory cell is read and the memory cell is recharged before data is lost based on read information. Only when such an operation is periodically repeated can storage of data be maintained. This memory cell recharge process is called a refresh operation.

Figure 1:
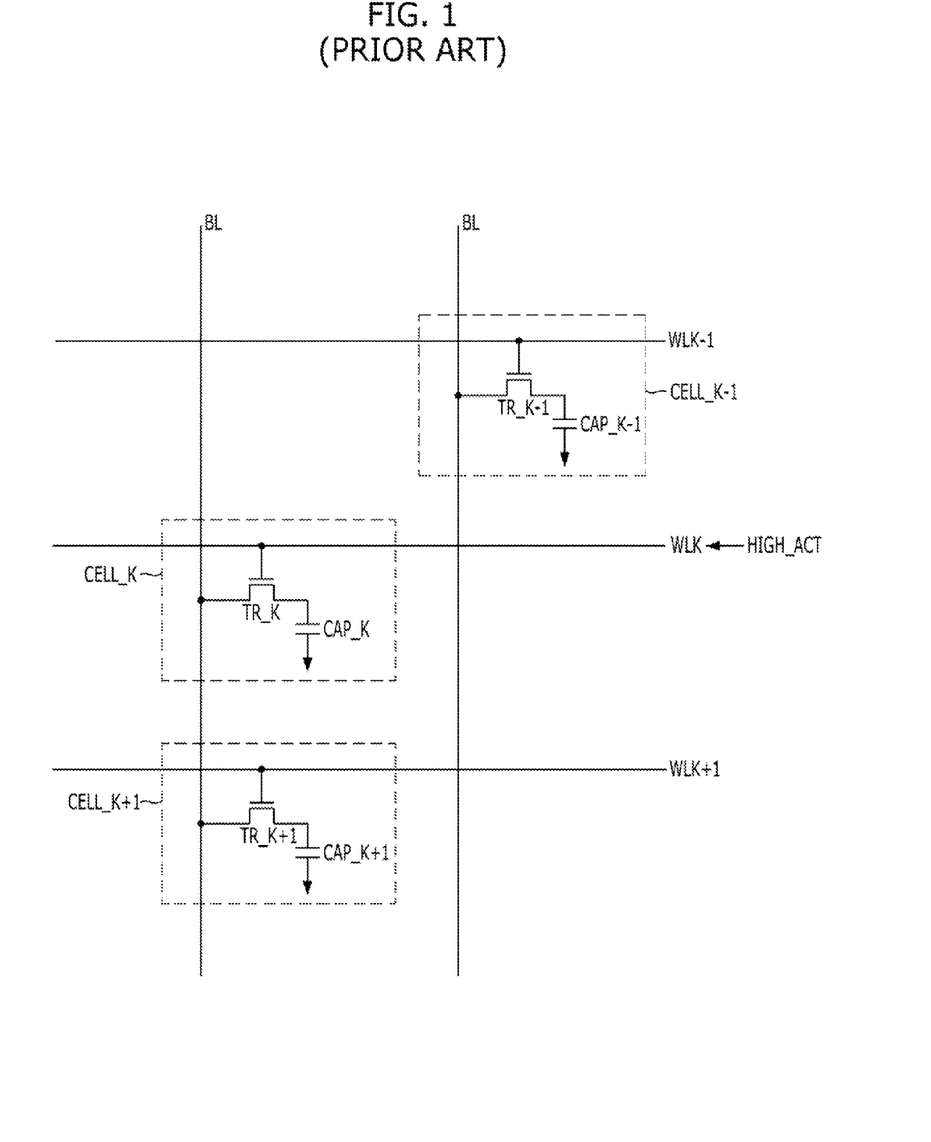
FIG. 1 is a diagram illustrating a part of a cell array included in a memory in order to explain a word line disturbance phenomenon.

FIG. 1 is a diagram illustrating a part of a cell array included in a memory in order to explain a word line disturbance phenomenon, 'BL' indicates a bit line.

In FIG. 1, 'WLK−1', 'WLK', and 'WLK+1' in the cell array indicate three word lines arranged in parallel with one another. The word line WLK marked by 'HIGH_ACT' indicates a word line that has had a large number of activation times or a high activation frequency, and the word lines WLK−1 and the WLK+1 are word lines arranged adjacent to the word line WLK. 'CELL_K−1', 'CELL_K', and 'CELL_K+1' indicate memory cells electrically coupled to the word lines WLK−1, WLK, and WLK+1, respectively. The memory cells CELL_K−1, CELL_K, and CELL_K+1 include a cell transistor TR_K−1 and a cell capacitor CAP_K−1, a cell transistor TR_K and a cell capacitor CAP_K, and a cell transistor TR_K+1 and a cell capacitor CAP_K+1, respectively.

In FIG. 1, when the word line WLK is activated and precharged (or deactivated), voltages of the word lines WLK−1 and WLK+1 rise and fall due to a coupling phenomenon occurring between the word line WLK and the word lines WLK−1 and WLK+1, resulting in an influence on the amount of charge stored in the cell capacitors CAP_K−1 and CAP_K+1. Therefore, when the word line WLK is excessively activated, precharged, and is toggled between an activated state and a precharged state, data stored in the memory cells CELL_K−1 and CELL_K+1 may be lost due to a change in the amount of charge stored in the capacitors CAP_K−1 and CAP_K+1.

Furthermore, electromagnetic waves generated in the toggling of the word line between the activated state and the precharged state causes the transfer of electrons to/from electrically coupled memory cell capacitors in adjacent word lines causing data loss.

SUMMARY

Various embodiments of the present invention are directed to a memory and a memory system that refreshes word lines adjacent to highly active word lines and substantially prevents data loss of electrically coupled memory cells.

Also, various embodiments of the present invention are directed to a memory and a memory system that reduces the number of times a refresh operation is performed in cases where there is a low probability of generating a highly active word line, which reduces power consumption.

In an embodiment, a memory may include a plurality of word lines; a target address generation unit suitable for generating one or more target addresses by using a stored address; a refresh control section suitable for activating a refresh signal in response to a refresh command that is periodically inputted, and periodically activating the refresh signal in a self-refresh mode; a target refresh control section suitable for activating a target refresh signal when the refresh signal is activated M times, wherein the M is a natural number, and deactivating the target refresh signal in the self-refresh mode; and a row control section suitable for sequentially refreshing the plurality of word lines in response to the refresh signal, and refreshing a word line corresponding to the target address in response to the refresh signal when the target refresh signal is activated.

The memory may include an address detection unit, suitable for detecting an address of a word line of the plurality of word lines which has been activated a reference number of times or more, or activated at a frequency of a reference value or more.

The refresh control section may include a period signal generation part suitable for activating a period signal in response to a self-refresh entry command, and deactivating the period signal in response to a self-refresh exit command, wherein the period signal indicates the self-refresh mode; a self-refresh signal generation part suitable for periodically activating a self-refresh signal when the period signal is activated; and a refresh signal generation part suitable for generating the refresh signal in response to the refresh command or the self-refresh signal.

In an embodiment, a memory may include a plurality of word lines; a target address generation unit suitable for generating one or more target addresses by using a stored address; and a control unit suitable for sequentially refreshing the plurality of word lines in response to a refresh command that is periodically inputted, with a target refresh operation of refreshing a word line corresponding to the target address when the word lines are refreshed a reference number of times, and sequentially refreshing the plurality of word lines without the target refresh operation in a self-refresh mode.

The memory may include an address detection unit suitable for detecting an address of a word line, which is activated a reference number of times or more, or activated at a frequency of a reference value or more.

In an embodiment, a memory system may include a memory controller suitable for periodically generating a refresh command and sequentially generating a self-refresh entry command and a self-refresh exit command; and a memory including a plurality of word lines and an address generation unit for generating one or more target addresses by using a stored address, and suitable for entering and ending a self-refresh mode in response to the self-refresh entry command and the self-refresh exit command, respectively, wherein the memory is suitable for sequentially refreshing the plurality of word lines in response to the refresh command, sequentially refreshing the plurality of word lines in the self-refresh mode, and refreshing a word line corresponding to the target address when the word lines are refreshed a reference number of times only in response to the refresh command.

The memory may include a refresh control section suitable for activating a refresh signal in response to the refresh command and periodically activating the refresh signal in the self-refresh mode; a target refresh control section suitable for activating a target refresh signal when the refresh signal is activated the number of reference times, and deactivating the target refresh signal in the self-refresh mode; and a row control section suitable for sequentially refreshing the plurality of word lines in response to the refresh signal, and refreshing a word line corresponding to the target address in response to the refresh signal when the target refresh signal is activated.

According to an embodiment of the present disclosure, word lines adjacent to a highly active word line are refreshed so data of memory cells electrically coupled to the word lines adjacent to the highly active word line is prevented from being lost.

According to another embodiment of the present disclosure, no target refresh operation is performed when no active word line is generated to reduce power consumption.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, a highly active word line may indicate a word line that satisfies one or more of the following conditions: the number of activation times is greater than or equal to a reference number and/or that the activation frequency is greater than or equal to a reference frequency. Hereinafter, a "normal refresh" operation indicates an operation in which a memory sequentially refreshes a plurality of word lines, and a "target refresh" operation indicates an operation in which a memory refreshes one or more word lines adjacent to a highly active word line.

Figure 2:
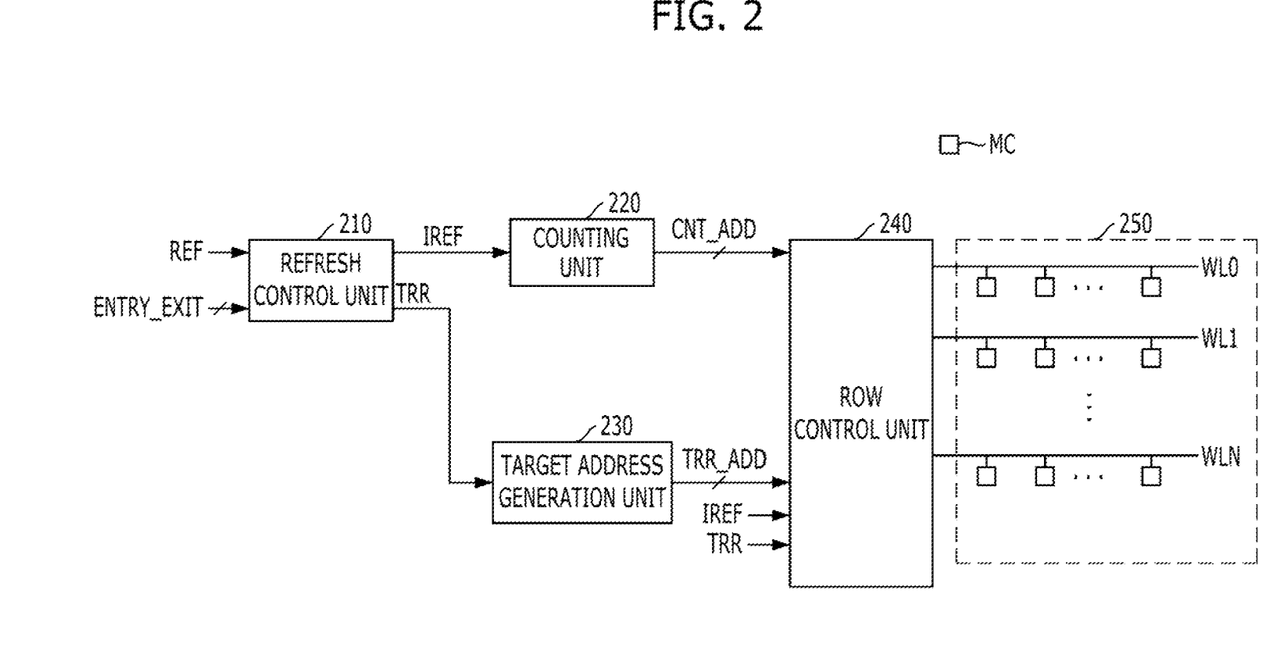
FIG. 2 is a diagram illustrating a part of a memory in order to explain a refresh operation.

FIG. 2 is a diagram illustrating part of a memory in order to explain a refresh operation.

As illustrated in FIG. 2, the memory may include a refresh control unit 210, a counting unit 220, a target address generation unit 230, a row control unit 240, and a cell array 250. The cell array 250 may include a plurality of word lines WL0 to WLN to which one or more memory cells MC are electrically coupled. The plurality of word lines WL0 to WLN may be arranged in sequence of 'WL0' to 'WLN'.

A refresh operation of the memory will be described with reference to FIG. 2.

The refresh control unit 210 may activate a refresh signal IREF when a refresh command REF is inputted and periodically activate the refresh signal IREF in a self-refresh mode. The self-refresh mode may be an operation mode that is entered in response to a self-refresh entry command ENTRY and is ended in response to a self-refresh exit command EXIT. In the self-refresh mode, the memory may sequentially refresh the plurality of word lines WL0 to WLN even though the refresh command REF is not inputted. The refresh control unit 210 may activate a target refresh signal TRR whenever the refresh signal IREF is activated M times (M is a natural number). When the target refresh signal TRR is activated, the memory may perform a target refresh operation for refreshing one or more word lines adjacent to a highly active word line. The target refresh signal TRR may be activated by the time necessary for performing the refresh operation. The target refresh signal TRR may be activated corresponding to a period in which the refresh signal IREF has been activated.

The counting unit 220 may generate counting information CNT_ADD having a value that is changed whenever the refresh signal IREF is activated. The counting unit 220 may increase the value of the counting information CNT_ADD by 1 whenever the refresh signal IREF is activated. Increasing the value of the counting information CNT_ADD by 1 represents that an address is changed such that a $(K+1)^{th}$ word line WLK+1 is selected after a $K^{th}$ word line WLK has been previously selected.

The target address generation unit 230 may detect a highly active word line with reference to information on word lines, which have been activated in the memory for a predetermined period, and store an address of a highly active word line. The target address generation unit 230 may generate a target address TAR_ADD corresponding to a word line adjacent to the highly active word line by using the stored address. The target address generation unit 230 may output the target address TAR_ADD when the target refresh signal TRR is activated. The target address TAR_ADD may be obtained by adding 1 or subtracting 1 to/from the address of the high active word line.

The row control unit 240 may refresh a word line corresponding to the counting information CNT_ADD when the refresh signal IREF is activated, and refresh a word line corresponding to the target address TAR_ADD when the refresh signal IREF is activated in the case where the target refresh signal TRR has been activated.

Figure 3:
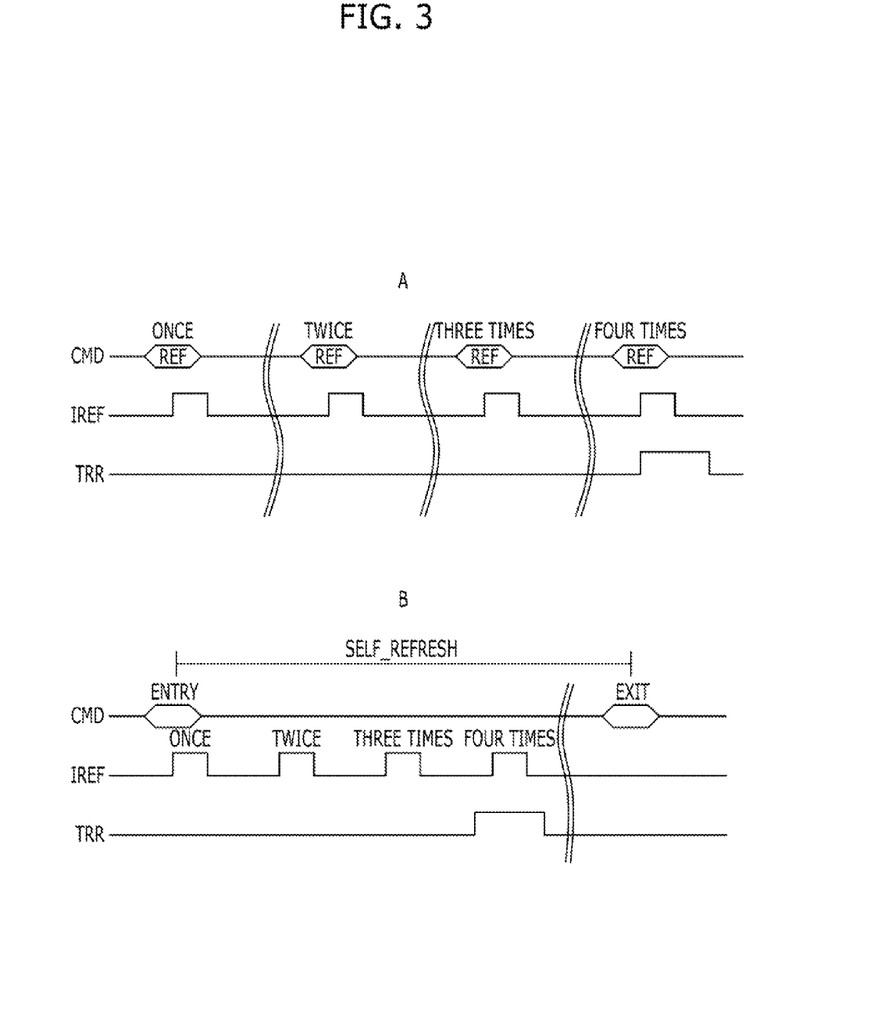
FIG. 3 is a waveform diagram for explaining the operation of the memory of FIG. 2.

FIG. 3 is a waveform diagram for explaining the operation of the memory of FIG. 2.

FIG. 3 illustrates the waveforms of the command CMD, the refresh signal IREF, and the target refresh signal TAR in Case A of performing the refresh operation in response to the refresh command REF and Case B of performing the refresh operation in the self-refresh mode. Hereinafter, a description will be provided for the case in which the target refresh signal TRR is activated whenever the refresh signal IREF is activated four times.

In Case A of performing the refresh operation in response to the refresh command REF, the refresh signal IREF is activated in response to the refresh command REF. When the refresh signal IREF is activated once, twice, and three times, a word line corresponding to the counting information CNT_ADD may be refreshed. When the refresh signal IREF is activated a fourth time, the target refresh signal TRR may be activated and a word line corresponding to the target address TAR_ADD may be refreshed. Since the memory performs active, read, and write operations with the refresh operation of the refresh command REF and the highly active word line may be generated, it is preferable to perform a target refresh operation.

In the Case B of performing the refresh operation in the self-refresh mode, the memory may enter the self-refresh mode in response to the self-refresh entry command ENTRY, and end the self-refresh mode in response to the self-refresh exit command EXIT. The refresh signal IREF is periodically activated in a self-refresh period SELF_REFRESH. When the refresh signal IREF is activated a fourth time, the target refresh signal TRR may be activated and the word line corresponding to the target address TAR_ADD may be refreshed, similar to Case A of performing the refresh operation in response to the refresh command REF.

However, in the self-refresh mode, the refresh operation is performed in a state where read and write operations for accessing data of the memory cell are not performed, such as a power-down state of the memory. Accordingly, in the self-refresh mode, active-precharge operations of word lines are performed only for the refresh operation, not for the read and write operation. Since the word lines are sequentially activated for the refresh operation, no highly active word line is generated.

In the target refresh, an additional refresh operation is performed for word lines adjacent to a highly active word line, resulting in an increase in current and power consumption. Therefore, when the target refresh is performed in the self-refresh mode, memory power consumption may increase.

Figure 4:
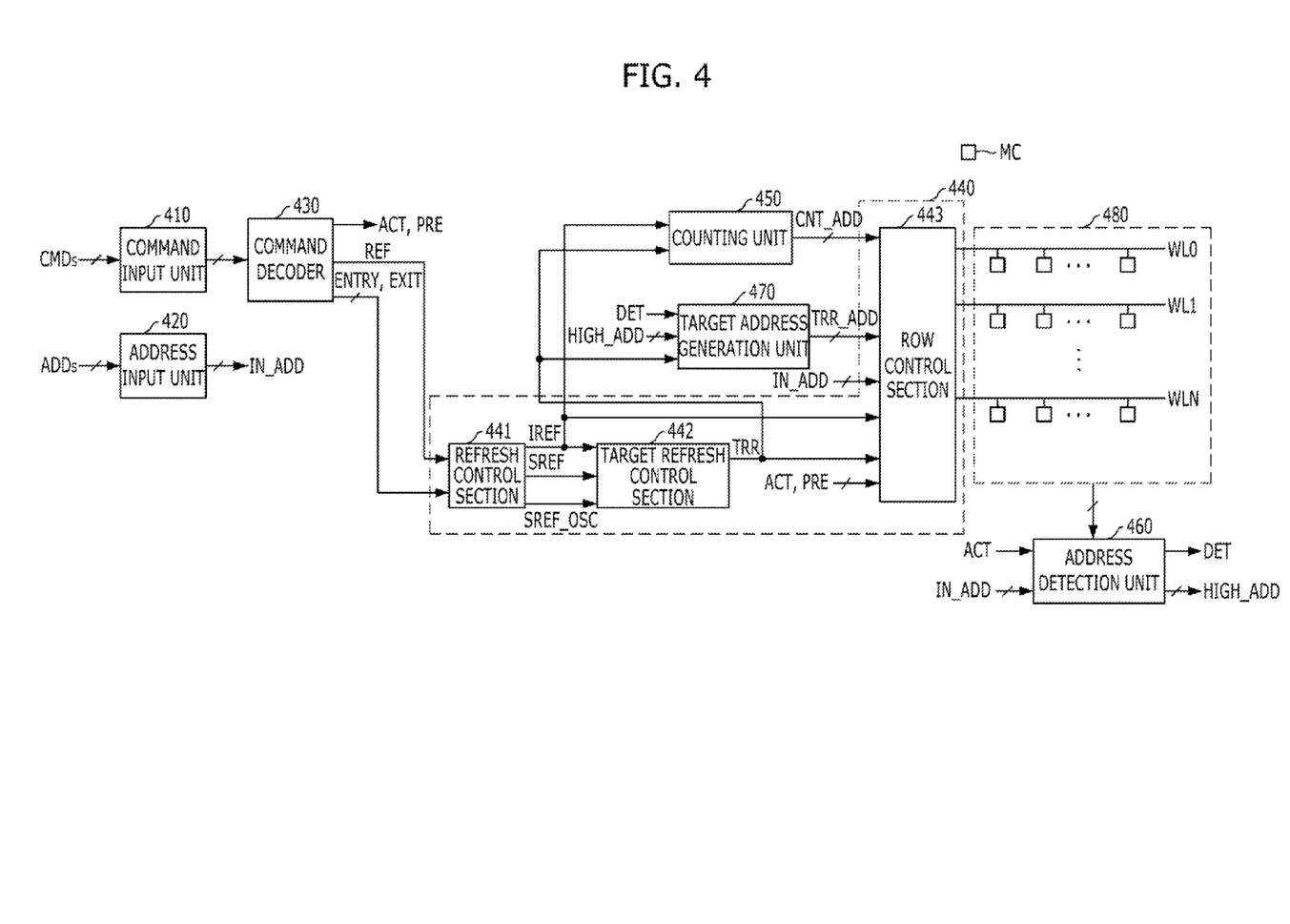
FIG. 4 is a configuration diagram of a memory in accordance with an embodiment of the present invention.

FIG. 4 is a configuration diagram of the memory in accordance with an embodiment of the present invention.

As illustrated in FIG. 4, the memory may include a command input unit 410, an address input unit 420, a command decoder 430, a control unit 440, a counting unit 450, an address detection unit 460, a target address generation unit 470, and a cell array 480. The cell array 480 may include a plurality of word lines WL0 to WLN to which one or more memory cells MC are electrically coupled. The plurality of word lines WL0 to WLN may be arranged in the sequence of 'WL0' to 'WLN'. FIG. 4 illustrates only the configuration related to an active operation and a refresh operation of the memory. Configurations not directly related to the present invention (for example, read and write operation, and the like) will be omitted.

With reference to FIG. 4, the memory will be described.

The command input unit 410 may receive commands CMDs and the address input unit 420 may receive addresses ADDs. Each of the commands CMDs and the addresses ADDs may include multibit signals.

The command decoder 430 may decode the command signals CMDs inputted through the command input unit 410 and generate an active command ACT, a precharge command PRE, a refresh command REF, a self-refresh entry command ENTRY, and a self-refresh exit command EXIT. The command decoder 430 may activate a command indicated by a combination of inputted command signals CMDs of the active command ACT, the precharge command PRE, the refresh command REF, the self-refresh entry command ENTRY, and the self-refresh exit command EXIT.

The counting unit 450 may generate counting information CNT_ADD having a value that is changed whenever the word lines WL0 to WLN are refreshed. The counting unit 450 may increase the value of the counting information CNT_ADD by 1 whenever the refresh signal IREF is activated. The counting information CNT_ADD is used as an address for selecting a word line for which a refresh is to be performed in the normal refresh operation. Increasing the value of the counting information by 1 represents that the counting information is changed such that a $(K+1)^{th}$ word line WLK+1 is selected next when a $K^{th}$ word line WLK has been previously selected.

When the target refresh signal TRR has been activated, the counting unit 450 may maintain the value of the counting information CNT_ADD without changing values although the refresh signal IREF is activated. In the target refresh operation, since a word line to be refreshed is selected using the target address TAR_ADD other than the counting information CNT_ADD, a next word line after the previously refreshed word line is selected and refreshed in a next normal refresh operation by maintaining the counting information CNT_ADD in the target refresh operation.

The address detection unit 460 may activate a detection signal DET and output an address HIGH_ADD of a highly active word line when the highly active word line (or a highly active address) is detected. The address detection unit 460 may detect the highly active word line of the plurality of word lines WL0 to WLN, wherein the highly active word line satisfies one or more conditions. The detection conditions may be a number of times of activation being greater than or equal to a reference number and/or that the activation frequency is greater than or equal to a reference frequency.

The address detection unit 460 may receive an active command ACT and an input address IN_ADD, count the number of times by which each word line has been activated in a predetermined period, compare the number of times by which each word line has been activated with a reference number of times, and detect a word line activated more than the reference number of times in the predetermined period. The address detection unit 460 may store a history of how many times each word line has been activated in a predetermined period, compare the frequency at which each word line has been activated with preset reference frequency, and detect a word line activated at a frequency more than the reference frequency in the predetermined period. The history of how many times each word line has been activated may be used to indicate which word line(s) has been highly active in the predetermined period. The address detection unit 460 may detect a word line by one or more of the aforementioned methods as the highly active word line. The reference number of times and the reference frequency may be set in consideration of the degree that the memory cell MC tolerates word line disturbance. The address detection unit 460 may directly receive information and history on the number of times each word line has been activated from the cell array 480 and as a result detect a highly active word line.

For example, the address detection unit 460 may set the reference number to $10^5$ and detect a word line activated more than $10^5$ times in a predetermined period. The address detection unit 460 may set the reference frequency to twice or more per five active operations and detect a word line activated more than twice or more per five active operations in a predetermined period. The predetermined period may be set corresponding to a specific time by using a timer, or the active command ACT or the refresh command REF may be counted and then the predetermined period may be set corresponding to a period in which the command has been inputted a predetermined number of times.

The target address generation unit 470 may store the address (HIGH_ADD, hereinafter, referred to as a highly active address) of the highly active word line outputted from the address detection unit 460 when the detection signal DET is activated, and generate the target address TAR_ADD when the target refresh signal TRR is activated. The target address TAR_ADD may include an address of one or more word lines adjacent to a highly active word line. The target address generation unit 470 may generate the target address TAR_ADD by adding 1 or subtracting 1 to/from the value of the stored highly active address HIGH_ADD and output the target address TAR_ADD when the target refresh signal TRR is activated. When the highly active word line is a $K^{th}$ word line WLK, a value obtained by subtracting 1 from the value of the highly active address HIGH_ADD may correspond to a $(K-1)^{th}$ word line WLK−1, and a value obtained by adding 1 to the value of the highly active address HIGH_ADD may correspond to a $(K+1)^{th}$ word line WLK+1.

The control unit 440 may sequentially refresh the plurality of word lines WL0 to WLN in response to the refresh command REF that is periodically inputted (normal refresh), may sequentially refresh the plurality of word lines WL0 to WLN in the self-refresh mode (self-refresh), may refresh a word line corresponding to the target address TAR_ADD when a word line is refreshed M times (target refresh), and may not refresh the word line corresponding to the target address TAR_ADD in the self-refresh mode.

The control unit 440 may enter the self-refresh mode in response to the self-refresh entry command ENTRY and end the self-refresh mode in response to the self-refresh exit command EXIT. The control unit 440 may refresh the word line corresponding to the target address TAR_ADD after a refresh operation of a word line started in the self-refresh mode is completed. Such an operation may substantially prevent the target refresh operation from being performed before the refresh operation of the word line started in the self-refresh mode is completed, and thus an address used in word line selection is prevented from being changed from the counting information CNT_ADD to the target address TAR_ADD.

In order to perform the aforementioned operation, the control unit 440 may include a refresh control section 441, a target refresh control section 442, and a row control section 443. The refresh control section 441 may generate a signal for controlling the normal refresh operation and the self-refresh operation of the memory. The refresh control section 441 may activate the refresh signal IREF in response to the refresh command REF that is periodically inputted, and periodically activate the refresh signal IREF in the self-refresh mode even though the refresh command REF is not inputted. The refresh control section 441 may activate a period signal SREF indicating that the memory is in the self-refresh mode in response to the self-refresh entry command ENTRY, and deactivate the period signal SREF in response to the self-refresh exit command EXIT.

The target refresh control section 442 may generate a signal for controlling the target refresh operation of the memory. The target refresh control section 442 may activate the target refresh signal TRR when the refresh signal IREF is activated M times, and deactivate the target refresh signal TRR regardless of the number of times of activation of the refresh signal IREF when the period signal SREF has been activated (the self-refresh mode). The target refresh control section 442 may count the refresh signal IREF, activate the target refresh signal TRR whenever the refresh signal IREF is counted M times, and deactivate the target refresh signal TRR when the period signal SREF has been activated. The target refresh signal TRR may be activated in time necessary for performing the refresh operation. The target refresh signal TRR may be activated corresponding to a period in which the refresh signal IREF has been activated.

The target refresh control section 442 may activate the target refresh signal TRR after the refresh signal IREF activated in the self-refresh mode is deactivated. That is, in the case where the refresh signal IREF (activated when the period signal SREF has been activated) is in an activated state even after the period signal SREF is deactivated, the target refresh control section 442 may activate the target refresh signal TRR after the refresh signal IREF is deactivated. The purpose is to prevent an address from being changed during a refresh operation.

The row control section 443 may activate a word line corresponding to the input address IN_ADD in response to the active command ACT and precharge an activated word line in response to a precharge command PRE. The row control section 443 may sequentially refresh the plurality of word lines WL0 to WLN in response to the refresh signal IREF, and refresh a word line corresponding to the target address TAR_ADD in response to the refresh signal IREF when the target refresh signal TRR is activated.

The memory may sequentially refresh the word lines in the normal refresh operation and perform the target refresh operation whenever the word lines are refreshed several times, thereby preventing data of the memory cells electrically coupled to word lines adjacent to a highly active word line from deteriorating due to word line disturbance. Furthermore, the memory performs no target refresh in self-refresh mode where the probability of the word line disturbance is low, thereby reducing power consumed by the refresh operation.

Figure 5:
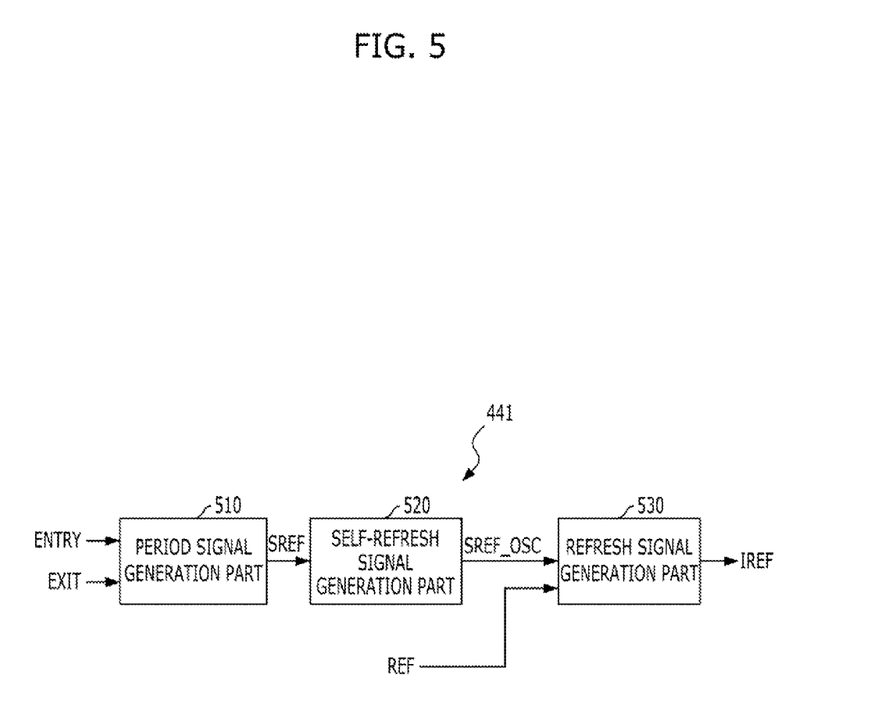
FIG. 5 is a configuration diagram of a refresh control section 441.

FIG. 5 is a configuration diagram of the refresh control section 441.

As illustrated in FIG. 5, the refresh control section 441 may include a period signal generation part 510, a self-refresh signal generation part 520, and a refresh signal generation part 530.

The period signal generation part 510 may generate the period signal SREF, activate the period signal SREF in response to the self-refresh entry command ENTRY, and deactivate the period signal SREF in response to the self-refresh exit command EXIT.

The self-refresh signal generation part 520 periodically activates a self-refresh signal SREF_OSC when the period signal SREF has been activated. The self-refresh signal generation part 520 may include an oscillator that is activated in response to the period signal SREF.

The refresh signal generation part 530 may generate the refresh signal IREF in response to the refresh command REF or the self-refresh signal SREF_OSC. When the refresh command REF or the self-refresh signal SREF_OSC is activated, the refresh signal generation part 530 may activate the refresh signal IREF.

Figure 6:
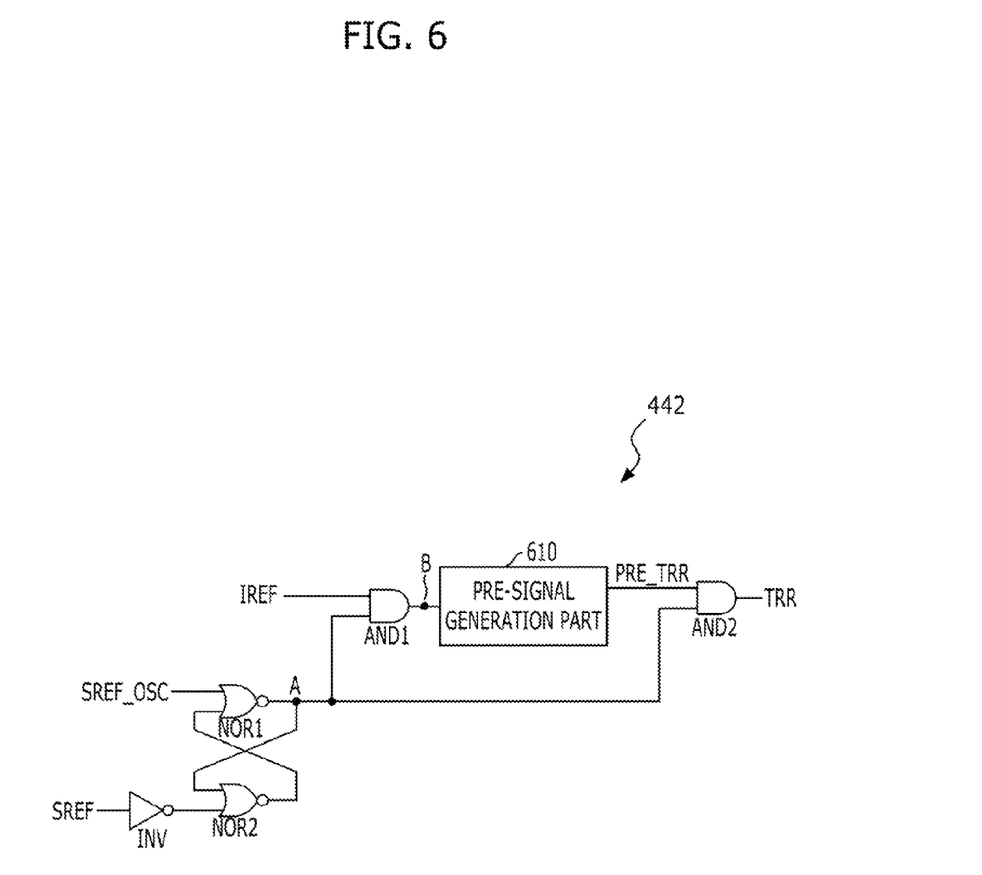
FIG. 6 is a configuration diagram of a target refresh control section 442.

FIG. 6 is a configuration diagram of the target refresh control section 442.

As illustrated in FIG. 6, the target refresh control section 442 may include an inverter INV, a plurality of gates AND1, AND2, NOR1, and NOR2, and a pre-signal generation part 610.

The pre-signal generation part 610 may perform counting whenever the output of the AND gate AND1 is activated (high), and activate a pre-signal PRE_TRR for a preset period when the counting is performed M times.

The inverter INV and the NOR gates NOR1 and NOR2 may receive the period signal SREF and the self-refresh signal SREF_OSC and generate a signal A for substantially preventing the activation of the target refresh signal TRR.

When the period signal SREF and the self-refresh signal SREF_OSC are low (deactivated), the signal A may be outputted as high (activated). In this case, the output of the AND gate AND1 is substantially equal to the refresh signal IREF and the target refresh signal TRR is substantially equal to the pre-signal PRE_TRR. Consequently, the pre-signal generation part 610 performs the counting whenever the refresh signal IREF is activated, thereby activating the pre-signal PRE_TRR when the counting is performed M times.

When the memory enters the self-refresh mode, the period signal SREF is high (activated), the self-refresh signal SREF_OSC is high (activated), the signal A may be outputted as low (deactivated), and the output of the AND gate AND1 and the output of the AND gate AND2 are low so that the refresh signal IREF and the pre-signal PRE_TRR may be blocked by the AND gates AND1' and AND2, respectively. Although the refresh signal IREF is activated, since the output of the AND gate AND1 is not activated, the pre-signal generation part 610 performs no counting operation. Although the pre-signal PRE_TRR is activated, since the output of the AND gate AND2, that is the target refresh signal TRR is not activated, the memory performs no target refresh operation.

When the self-refresh mode has ended, the period signal SREF is low (deactivated) and the self-refresh signal SREF_OSC is low (deactivated). Since the signal A may be outputted to be high (activated) again, the refresh signal IREF is transferred as the output of the AND gate AND1 and the pre-signal PRE_TRR is transferred as the target refresh signal TRR, so that the memory may perform the target refresh operation.

Figure 7:
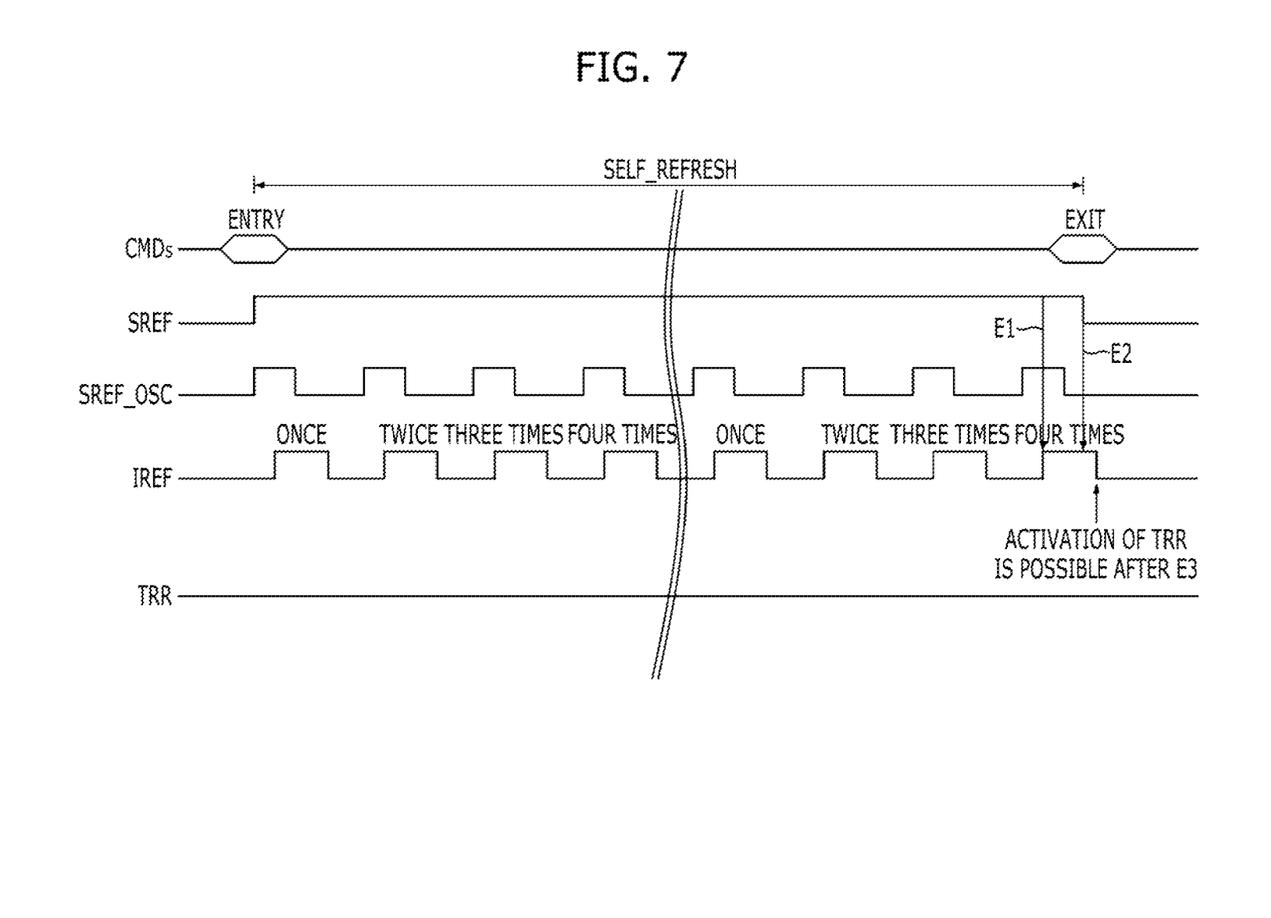
FIG. 7 is a waveform diagram for explaining the operation of the memory of FIG. 4.

FIG. 7 is a waveform diagram for explaining the operation of the memory of FIG. 4.

In performing the normal refresh operation, the memory operation is substantially the same as described in reference FIG. 3. Performing the self-refresh operation of the memory is as follows. A description will now be provided for the case where the target refresh signal TRR is activated when the refresh signal IREF is activated four times.

When the self-refresh entry command ENTRY is inputted, the period signal SREF may be activated and a self-refresh period SELF_REFRESH may be started. In the self-refresh period SELF_REFRESH, the self-refresh signal SREF_OSC may be periodically activated and the refresh signal IREF may be activated in response to the self-refresh signal SREF_OSC. When the refresh signal IREF has been activated once, twice, and three times, a word line corresponding to the counting information CNT_ADD may be refreshed. When the refresh signal IREF has been activated a fourth time, the target refresh signal TRR is activated in the case of the normal refresh operation, but since the period signal SREF has been activated, the target refresh signal TRR may not be activated. Consequently, the word line corresponding to the counting information CNT_ADD may be refreshed.

When the self-refresh exit command EXIT is inputted, the period signal SREF may be deactivated and the self-refresh period SELF_REFRESH may be ended. In the state in which the refresh signal IREF has been activated four times, the period signal SREF has been activated (E1) at the point which the refresh signal IREF is activated. However, in the state in which the refresh signal IREF has been activated, when the period signal SREF has been deactivated (E2), the target refresh signal TRR may not be activated until the refresh signal IREF is deactivated (E3) in order to substantially prevent an address used for selecting a word line from being changed.

As described above, the memory of FIG. 4 may substantially prevent the target refresh operation from being performed in the self-refresh mode by using the period signal SREF and the refresh signal IREF, and may reduce power consumed by the refresh operation.

Figure 8:
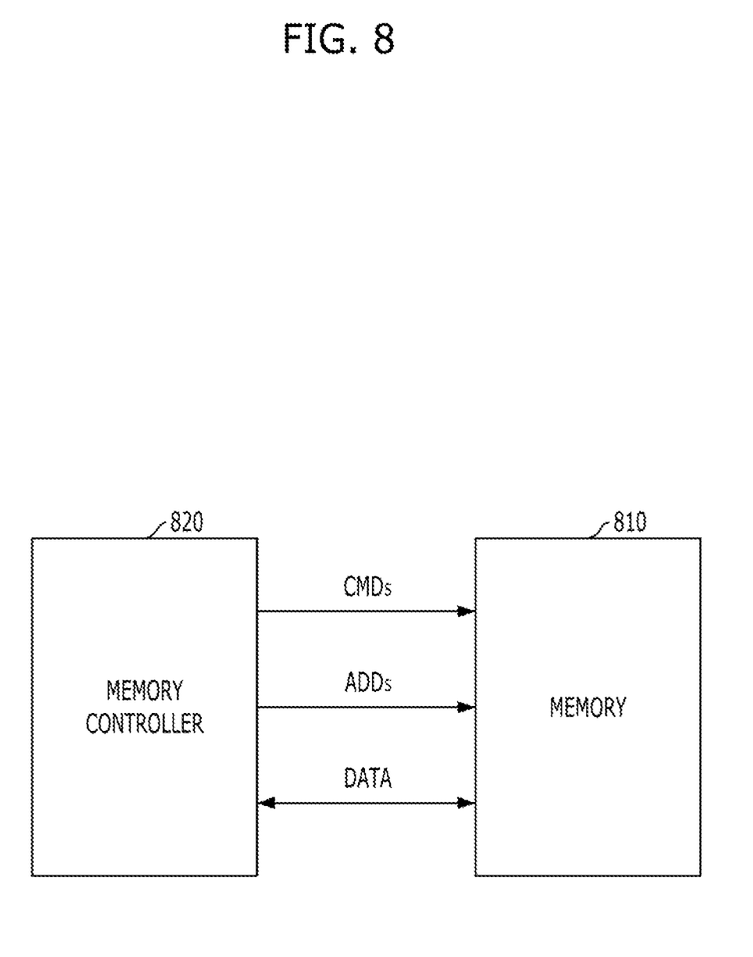
FIG. 8 is a configuration diagram of a memory system in accordance with an embodiment of the present invention.

FIG. 8 is a configuration diagram of a memory system in accordance with an embodiment of the present invention.

As illustrated in FIG. 8, the memory system may include a memory 810 and a memory controller 820.

The memory controller 820 controls the operation of the memory 810 by applying commands CMDs and addresses ADDs to the memory 810 and exchanges data DATA with the memory 810 in read and write operations. The memory controller 820 transmits the command signals CMDs, thereby inputting an active command ACT, a precharge command PRE, a refresh command REF, a self-refresh entry command ENTRY, and a self-refresh exit command EXIT to the memory 810. In the case of inputting the active command ACT, the memory controller 820 may transmit the addresses ADDs that are used when the memory 810 selects a cell block and a word line to be activated. The memory controller 820 may periodically transmit the refresh command REF to the memory 810, and may transmit the self-refresh entry command ENTRY and the self-refresh exit command EXIT in order to control the self-refresh mode of the memory 810.

The memory 810 may include the memory described in FIG. 4. The memory 810 may detect an address of a highly active word line. The memory 810 may detect and store the address of the highly active word line and generate a target address. The memory 810 may perform a target refresh operation using the target address whenever a refresh operation is performed a predetermined number of times in a normal refresh operation. In the case of entering the self-refresh mode, the memory 810 may periodically perform the refresh operation even though the refresh command REF is not inputted from the memory controller 820. Particularly, the memory 810 may not perform the target refresh operation in the self-refresh mode. The configuration and operation of the memory 810 for performing the refresh operations are substantially equal to those described FIG. 4 to FIG. 7.

The memory system performs the target refresh operation for word lines adjacent to a highly active word line, reduces error due to word line disturbance, and does not perform the target refresh operation in the self-refresh mode, thereby reducing power consumption.

Although various embodiments have been described for illustrative purposes, it will be apparent to those skilled in the art that various changes and modifications may be made without departing from the spirit and scope of the invention as defined in the following claims.

What is claimed is:
1. A memory comprising:
a plurality of word lines;
a target address generation unit configured to generate one or more target addresses by using a stored address;

a refresh control section configured to activate a refresh signal in response to a refresh command that is periodically inputted, and periodically activate the refresh signal in a self-refresh mode;

a target refresh control section configured to activate a target refresh signal when the refresh signal is activated M times, wherein M is a natural number, and deactivate the target refresh signal in the self-refresh mode in which the refresh command is not inputted; and a row control section sequentially refresh a plurality of first word lines in response to the refresh signal, and refresh a second word line corresponding to the target address in response to the refresh signal when the target refresh signal is activated.

2. The memory of claim 1, further comprising:

an address detection unit configured to detect an address of a first word line of the plurality of first word lines, which is activated by a reference number of times or more, or activated at a frequency of a reference value or more, wherein the target address generation unit stores the address detected by the address detection unit, and the one or more target addresses correspond to one or more adjacent word lines adjacent to a word line corresponding to the detected address.

3. The memory of claim 1, further comprising:

a counting unit configured to generate counting information that is changed in response to the refresh signal, substantially maintain the counting information when the target refresh signal is activated, and output the counting information to the row control section.

4. The memory of claim 3, wherein the row control section refreshes a first word line corresponding to the counting information in response to the refresh signal when the target refresh signal is deactivated.

5. The memory of claim 1, wherein the refresh control section comprises:

a period signal generation part configured to activate a period signal in response to a self-refresh entry command, and deactivate the period signal in response to a self-refresh exit command, wherein the period signal indicates the self-refresh mode;

a self-refresh signal generation part configured to periodically activate a self-refresh signal when the period signal is activated; and a refresh signal generation part configured to generate the refresh signal in response to the refresh command or the self-refresh signal, wherein the target refresh control section activates the target refresh signal when the refresh signal is counted M times, and deactivates the target refresh signal when the period signal is activated.

6. The memory of claim 5, wherein the target refresh control section activates the target refresh signal after a refresh signal activated in the self-refresh mode is deactivated.

7. The memory of claim 1, wherein the target address generation unit outputs the one or more target addresses to the row control section when the target refresh signal is activated.

8. A memory comprising:

a plurality of word lines;

a target address generation unit configured to generate one or more target addresses by using a stored address; and a control unit configured to sequentially refresh a plurality of first word lines in response to a refresh command that is periodically inputted, with a target refresh operation of refreshing a second word line corresponding to the target address when the first word lines are refreshed a reference number of times, and sequentially refresh the plurality of word lines without the target refresh operation in a self-refresh mode in which the refresh command is not inputted.

9. The memory of claim 8, further comprising:

an address detection unit configured to detect an address of a word line of the plurality of word lines, which is activated a reference number of times or more, or activated at a frequency of a reference value or more, wherein the target address generation unit stores the address detected by the address detection unit, and the one or more target addresses correspond to one or more adjacent word lines adjacent to a word line corresponding to the detected address.

10. The memory of claim 8, further comprising:

a counting unit configured to generate counting information that is changed when a first word line is refreshed, substantially maintain the counting information in the target refresh operation, and output the counting information to the control unit.

11. The memory of claim 10, wherein the control unit refreshes the first word line corresponding to the counting information in response to the refresh command, refreshes the second word line corresponding to the target address in the target refresh operation, and refreshes the first word line corresponding to the counting information in the self-refresh mode.

12. The memory of claim 8, wherein the control unit refreshes the second word line corresponding to the target address after a first word line started to be refreshed at an end of the self-refresh mode is completed.

13. A memory system comprising:

a memory controller configured to periodically generate a refresh command, and generate a self-refresh entry command for entering a self-refresh mode and a self-refresh exit command for exiting the self-refresh mode, wherein the refresh command is not generated in the self-refresh mode; and a memory including a plurality of word lines and an address generation unit for generating one or more target addresses by using a stored address, and configured to enter and end the self-refresh mode in response to the self-refresh entry command and the self-refresh exit command, respectively, wherein the memory is configured to sequentially refresh a plurality of first word lines in response to the refresh command, sequentially refresh the plurality of first word lines in the self-refresh mode in which the refresh command is not inputted, and refresh a second word line corresponding to the target address when the first word lines are refreshed a reference number of times only in response to the refresh command.

14. The memory system of claim 13, wherein the memory detects an address of a first word line of the first plurality of word lines which is activated a reference number of times or more or activated at a frequency of a reference value or more, wherein the one or more target addresses correspond to one or more word lines adjacent to a first word line corresponding to the detected address.

15. The memory system of claim 13, wherein the memory comprises:

a refresh control section configured to activate a refresh signal in response to the refresh command and periodically activate the refresh signal in the self-refresh mode;

a target refresh control section configured to activate a target refresh signal when the refresh signal is activated the number of reference times, and deactivate the target refresh signal in the self-refresh mode; and a row control section configured to sequentially refresh the plurality of first word lines in response to the refresh signal, and refresh a second word line corresponding to the target address in response to the refresh signal when the target refresh signal is activated.

16. The memory system of claim 15, wherein the memory refreshes the second word line corresponding to the target address after a first word line started to be refreshed at an end of the self-refresh mode is completed.

* * * * *